(12) United States Patent
You

(10) Patent No.: US 9,240,206 B2
(45) Date of Patent: Jan. 19, 2016

(54) ELECTRONIC DEVICE AND AUDIO ADJUSTMENT METHOD

(75) Inventor: Qiang You, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 883 days.

(21) Appl. No.: 13/433,376

(22) Filed: Mar. 29, 2012

(65) Prior Publication Data
US 2013/0044897 A1   Feb. 21, 2013

(30) Foreign Application Priority Data

Aug. 19, 2011   (CN) .......................... 2011 1 0239627

(51) Int. Cl.
*H04R 9/06*   (2006.01)
*G11B 19/02*   (2006.01)
*G06F 3/0488*   (2013.01)
*H03G 3/04*   (2006.01)

(52) U.S. Cl.
CPC ............ *G11B 19/025* (2013.01); *G06F 3/0488* (2013.01); *H04R 9/06* (2013.01); *H03G 3/04* (2013.01)

(58) Field of Classification Search
CPC .... H04R 1/1041; H04R 5/033; H04R 1/1083; H04M 2250/02; H04M 1/05; H04M 1/6066
USPC ......... 381/104, 105, 109, 110, 119, 120, 123, 381/333, 334, 306, 61, 59, 302, 86; 345/177, 158, 156, 157, 159; 455/420, 455/556.1; 700/94
See application file for complete search history.

(56) References Cited

U.S. PATENT DOCUMENTS

2008/0180408 A1*   7/2008   Forstall et al. ................ 345/177

* cited by examiner

*Primary Examiner* — Leshui Zhang
(74) *Attorney, Agent, or Firm* — Novak Druce Connolly Bove + Quigg LLP

(57) ABSTRACT

An electronic device with a touch sensitive display comprises an identifying module, a detecting module, an adjusting module, and an outputting module. The identifying module identifies the touch operation on the touch sensitive display and generates corresponding touch information. The detecting module detects the status of the electronic device and generates a status signal. The adjusting module adjusts the parameter of the audio signal according to the status signal and the touch information. The outputting module outputs the adjusted audio signal.

17 Claims, 3 Drawing Sheets

ELECTRONIC DEVICE AND AUDIO ADJUSTMENT METHOD

BACKGROUND

1. Technical Field

The present disclosure relates to an electronic device, and particularly to an electronic device for playing audio signals.

2. Description of Related Art

When an electronic device plays music, a working window including a plurality of buttons for playing the music is always provided. In some cases the normal working window can only be operated to play, pause, switch or change the speed of the music being played. The other parameters of the music cannot be changed by a user, such as the bass frequency, the treble frequency, the intensity of the rhythm.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout three views.

DETAILED DESCRIPTION

Figure 1:
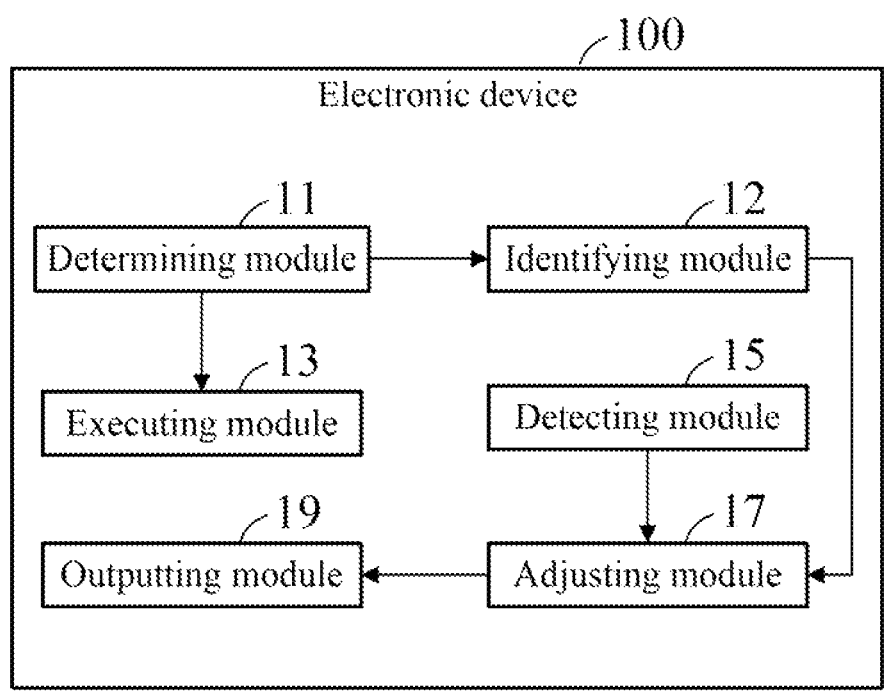
FIG. 1 is a block diagram of an electronic device in accordance with an embodiment.

FIG. 1 is an electronic device 100 with an equalization function of the audio signal being provided. The electronic device 100 can adjust the different parameters of the music according to the operation of a user, in different statuses, such as the bass frequency, the treble frequency, the tone, the rhythm. In the embodiment, the electronic device 100 includes a speed status, a tone status, a rhythm status, and a playing status. When the electronic device 100 is in speed status, the speed of the music being played is adjustable. When the electronic device 100 is in tone status, the frequency of the bass or the treble is adjustable. When the electronic device 100 is in rhythm status, the intensity of the playing music is adjustable. When the electronic device 100 is in playing status, the volume, the disc, and the playing speed of the music being played are adjustable. In the embodiment, the electronic device 100 can be a mobile phone, audio/video player, and PDA, for example.

Figure 2:
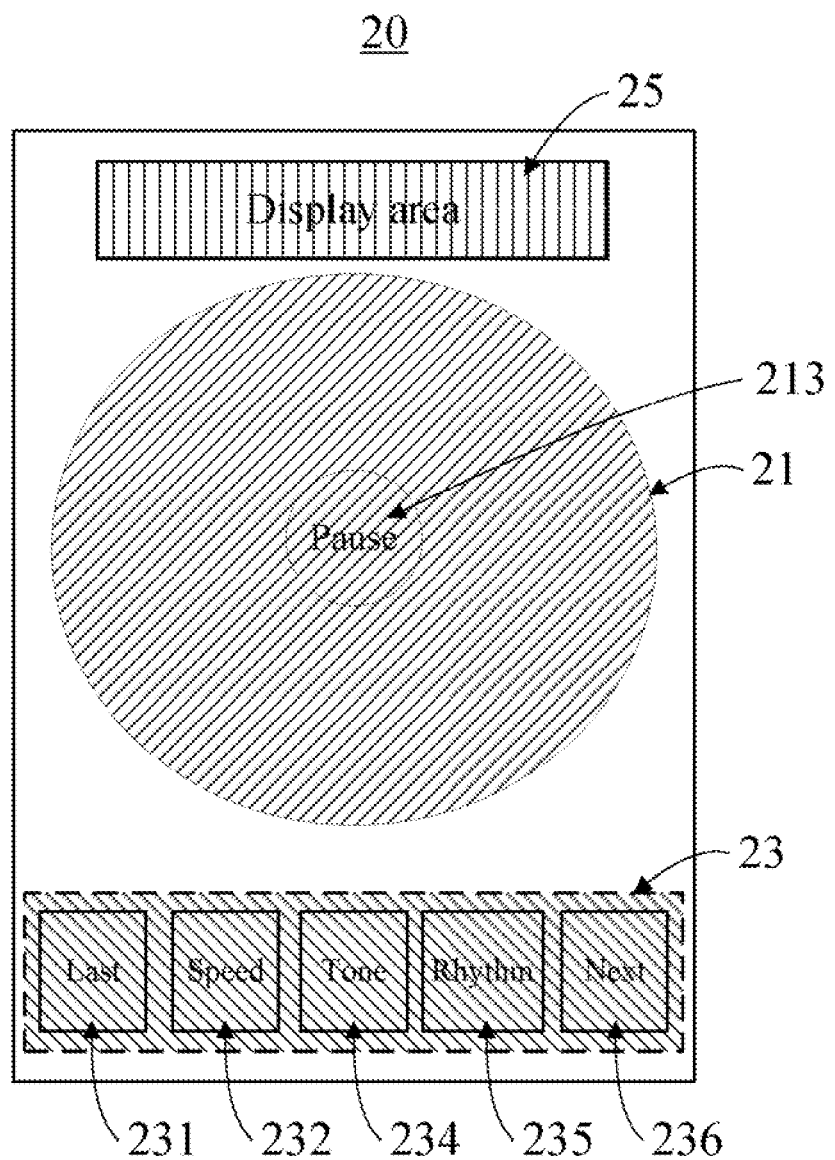
FIG. 2 is a schematic diagram showing a touch sensitive display of the electronic device of FIG. 1

FIG. 2 is a touch sensitive display 20 of the electronic device 100 for receiving operations of a user. The touch sensitive display 20 includes a first touch area 21, a second touch area 23, and a display area 25. The first touch area 21 is set in the middle of the touch sensitive display 20 and provides a first predetermined touch range. In the embodiment, the first touch area 21 is disc-shaped. The first touch area 21 further includes a "pause" button set in the middle of the first touch area 21.

The second touch area 23 is set below the first touch area 21 and provides a second predetermined touch range. The second touch area 23 includes a plurality of function buttons. Each button is corresponding to a different function. In the embodiment, the second touch area 23 is substantially rectangle-shape, and the second touch area 23 includes a "Last" function button 231, a "Speed" function button 232, a "Tone" function button 234, a "Rhythm" function button 235, and a "Next" function button 236. The "Last" function button 231 and the "Next" function button 236 activate the electronic device to be in the playing status. The "Speed" function button 232 activates the electronic device to be in the speed status. The "Tone" function button 234 activates the electronic device to be in the tone status. The "Rhythm" function button 235 activates the electronic device to be in the rhythm status.

The display area 25 set above the first touch area 21 is used for displaying the information of the music being played. In the embodiment, the display area 25 displays the lyrics of the music being played in a rolling method. In the other embodiment, the display area 25 can display the singer name and the title of the music being played.

The electronic device 100 further includes a determining module 11, an identifying module 12, an executing module 13, a detecting module 15, an adjusting module 17, and an outputting module 19.

The determining module 11 determines whether the touch operation has occurred in the first touch area 21. If the first touch area 21 is touched, the determining module 11 generates a triggering signal. If the second touch area 23 is touched, the determining module 11 further detects the touch function button of the second touch area 23 and generates a corresponding function signal. In the embodiment, table 1 below records the relationship between the touch function button and the function signal.

Table 1 Shows the Relationship Between the Touch Function Button and the Function Signal

| Touch function button | Function signal |
| --- | --- |
| Speed | Speed function signal |
| Tone | Tone function signal |
| Rhythm | Rhythm function signal |
| Last | Last function signal |
| Next | Next function signal |

The identifying module 12 identifies the touch operation of the user on the first touch area 21 in response to the triggering signal and generates touch information. In the embodiment, the touch information includes the track and the displacement of the touch operation. The track includes the shape and the direction of the operation. In the embodiment, the track includes a clockwise arc, an anti-clockwise arc, a straight line from left to right, a straight line from right to left, a straight line from up to down, and a straight line from down to up. In the other embodiments, the touch information further can include a pressure touch, the time in a predetermined time interval, and the duration of the touching operation.

The executing module 13 executes the corresponding function according to the function signal. In the embodiment, the electronic device 100 respectively switches to the corresponding status according to the speed function signal, the tone function signal, or the rhythm function signal; the electronic device 100 switches to playing status and respectively executes to play the last disc or the next disc according to the last function signal or the next function signal.

The detecting module 15 detects the status of the electronic device 100 and generates a status signal. In the embodiment, table 2 below records the relationship between the status and the status signal.

Table 2 Shows the Relationship Between the Status and the Status Signal

| Status | Status signal |
| --- | --- |
| Speed status | Speed status signal |
| Tone status | Tone status signal |
| Rhythm status | Rhythm status signal |
| Playing status | Playing status signal |

The adjusting module 17 adjusts the parameters of the audio signal in a predetermined adjustment method according to the status signal and the touch information. Table 3 below records the relationships between the status signal, touch information, and the predetermined adjustment methods. In the embodiment, the parameter includes the frequency of the bass and the treble, the intensity of the rhythm, the playing speed, and the volume.

Table 3 Shows the Relationship Between Status Signal, Touch Information, and Adjustment Method

| Status signal | Touch information | Adjustment method |
| --- | --- | --- |
| Speed | Clockwise arc | Fast forward |
| Speed | Anti-clockwise arc | Fast backward |
| Speed | Straight line from left to right | — |
| Speed | Straight line from right to left | — |
| Speed | Straight line from up to down | — |
| Speed | Straight line from down to up | — |
| Tone | Clockwise arc | Treble boosting |
| Tone | Anti-clockwise arc | Bass boosting |
| Tone | Straight line from left to right | — |
| Tone | Straight line from right to left | — |
| Tone | Straight line from up to down | — |
| Tone | Straight line from down to up | — |
| Rhythm | Clockwise arc | Rhythm boosting |
| Rhythm | Anti-clockwise arc | Rhythm cutting |
| Rhythm | Straight line from left to right | — |
| Rhythm | Straight line from right to left | — |
| Rhythm | Straight line from up to down | — |
| Rhythm | Straight line from down to up | — |
| Play | Clockwise arc | — |
| Play | Anti-clockwise arc | — |
| Play | Straight line from left to right | Last disc |
| Play | Straight line from right to left | Next disc |
| Play | Straight line from up to down | Volume increasing |
| Play | Straight line from down to up | Volume decreasing |

The outputting module 19 outputs the adjusted audio signal.

Figure 3:
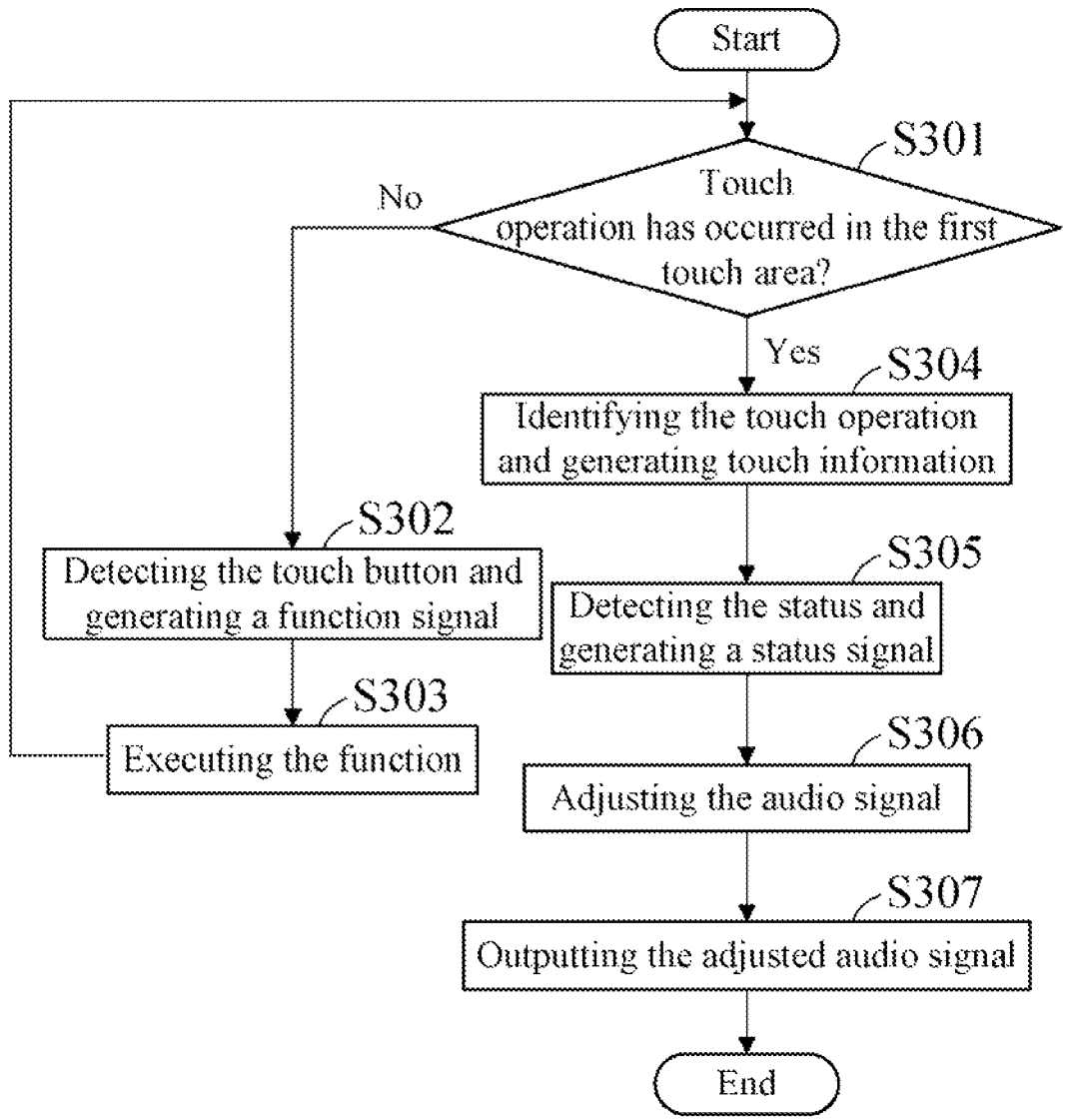
FIG. 3 is a flowchart of an adjustment method in accordance with an embodiment.

Referring to FIG. 3, an audio adjustment method adjusts the audio signal according to the touch operation on the touch sensitive display 20 in the different statuses. In the embodiment, the electronic device 100 includes a speed status, a tone status, a rhythm status, and a playing status. The touch sensitive display 20 includes a first disc-shaped touch area 21, a second rectangle touch area 23, and a rectangle display area 25. The first touch area 21 is set in the middle of the touch sensitive display 20. The second touch area 23 is below the first touch area 21. The display area 25 is above the first touch area 21. The audio adjustment method includes the following steps.

In step S301, the determining module 11 detects the touch operation on the touch sensitive display 20. If the touch operation has occurred in the first touch area 21, step S304 is implemented; if the touch operation has occurred in the second touch area 23, step S302 is implemented.

In step S302, the determining module 11 further detects the touch function button on the second touch area 23 and generates a corresponding function signal. In the embodiment, the second touch area 23 includes a "Last" function button 231, a "Speed" function button 232, a "Tone" function button 234, a "Rhythm" function button 235, and a "Next" function button 236.

In step S303, the executing module 13 executes the function according to the function signal, step S301 is implemented. In the embodiment, the electronic device 100 respectively switches to the corresponding status according to the speed function signal, the tone function signal, or the rhythm function signal; the electronic device 100 switches to the playing status and respectively executes to play the last disc or the next disc according to the last function signal or the next function signal.

In step S304, the identifying module 12 identifies the touch operation on the first touch area 21 and generates touch information. In the embodiment, the touch information includes the track and the displacement of the touch operation. The track includes the shape and the forming direction of the operation. In the other embodiments, the touch information further can include the displacement, the pressure, the amount of the touch operation in a predetermined time, and the duration of the touching operation.

In step S305, the detecting module 15 detects the status of the electronic device 100 and generates a status signal. In the embodiment, the speed function, the tone function, and the rhythm function are respectively corresponding to the speed status, the tone status, and the rhythm status, and the last function and the next function are corresponding to the playing status.

In step S306, the adjusting module 17 adjusts the audio signal in a corresponding adjustment method according to the status signal and the touch information.

In step S307, the outputting module 19 outputs the adjusted audio signal.

As described, by using the electronic device 100, the parameter of the music being play can be adjusted by an operation of the user on the touch sensitive display 20, such as the bass frequency, the treble frequency, the intensity of the rhythm, and so on. Thus the users, can adjust the parameters to suit their mood, as a disc jockey.

It is to be understood, however, that even though information and advantages of the present embodiments have been set forth in the foregoing description, together with details of the structures and functions of the present embodiments, the disclosure is illustrative only; and that changes may be made in detail, especially in matters of shape, size, and arrangement of parts within the principles of the present embodiments to the full extent indicated by the broad general meaning of the terms in which the appended claims are expressed.

What is claimed is:

1. An electronic device of playing an audio signal having a plurality of predetermined parameters and having a plurality of predetermined statuses, each of the plurality of predetermined status for allowing each of the plurality of predetermined parameters of the audio signal to be adjusted, the electronic device comprising:
   a touch sensitive display configured to provide a first predetermined touch area and a second predetermined touch area, which are displayed at the same time in a same interface of the electronic device, wherein the second predetermined touch area provides a plurality of function button, pressing each of plurality of function buttons activates the electronic device to be in a corresponding predetermined status of the plurality of predetermined statuses for allowing a corresponding predetermined parameter of the plurality of predetermined parameters of the audio signal to be adjusted;

a determining module configured to judge whether an touch operation occurred in the first predetermined touch area, and generate a triggering signal when the touch operation is occurred in the first predetermined touch area;

an identifying module configured to identify a track and a displacement of the touch operation on the first predetermined touch area in response to the triggering signal and generate a corresponding touch information;

a detecting module configured to detect the corresponding predetermined status of the electronic device and generate a corresponding status signal;

an adjusting module configured to adjust a corresponding predetermined parameter of the plurality of predetermined parameters of the audio signal according to a combination of the corresponding status signal generated by the detecting module and the corresponding touch information generated by the identifying module; and an outputting module configured to output the audio signal that is adjusted according to the corresponding predetermined parameter being adjusted by the adjusting module;

wherein each of different combinations of different status signals generated by the detecting module and different touch information generated by the identifying module adjusts a corresponding parameter of the plurality of predetermined parameters of the audio signal and the corresponding parameter corresponds to the predetermined status.

2. The electronic device of claim 1, wherein the first predetermined touch area is a disc-shape and set in the middle of the touch sensitive display.

3. The electronic device of claim 1, wherein the identifying track by the identifying module in the first predetermined touch area comprises a shape and a forming direction of the touch operation.

4. The electronic device of claim 3, wherein the identified shape by the identifying module in the first predetermined touch area includes different shapes of the touch operation being identified by the identifying module and wherein the different shapes comprise an arc and a straight line.

5. The electronic device of claim 1, wherein the predetermined statuses comprise a speed status, a tone status, a rhythm status, and a plying status; the electronic device switches between the predetermined statuses according to a touch operation on the second predetermined touch area; when the electronic device is in the speed status, a speed of the playing music is adjustable, when the electronic device is in the tone status, a frequency of the bass or the treble is adjustable, when the electronic device is in the rhythm status, the intensity of the playing music is adjustable, when the electronic device is in the playing status, the volume, the disc, and the playing speed of the playing audio signal being played are adjustable.

6. The electronic device of claim 5, wherein a position of the second predetermined touch area in the touch sensitive display is set below a position of the first predetermined touch area in the touch sensitive display, and the second predetermined touch area comprises a last function button, a speed function button, a tone function button, a rhythm function button, and a next function button, the speed function button, the tone function button, and the rhythm function button are respectively corresponding to the speed status, the tone status, and the rhythm status, and the last function button and the next function button are corresponding to the playing status.

7. The electronic device of claim 1, wherein the touch sensitive display further comprises a display area; a position of the display area in the touch sensitive display is set above a position of the first predetermined touch area in the touch sensitive display, the display area displays a lyric of the playing audio signal in a rolling method.

8. The electronic device of claim 1, wherein the adjusting module is further configured to respectively adjust the frequency of a bass, a frequency of a treble, an intensity of the rhythm, and a playing speed of the playing audio signal.

9. An adjustment method for adjusting an audio signal of an electronic device, the electronic device comprises a touch sensitive display and has a plurality of predetermined statuses and the audio signal has a plurality of predetermined parameters, each of the predetermined statuses for allowing each of the plurality of predetermined parameters of the audio signal to be adjusted, the adjustment method comprising:

detecting a track and a displacement of a touch operation on the touch sensitive display and generation a triggering signal when the touch operation is occurred in a first predetermined touch area in the touch sensitive display;

identifying the touch operation and generating a touch information according to the generated triggering signal;

detecting a current predetermined status of the plurality of predetermined statuses of the electronic device based on the touch operation in a second predetermined touch area in the touch sensitive display, the second predetermined touch area is displayed with the first predetermined touch area at the same time and in a same interface of the electronic device, and generating a corresponding status signal corresponding to the detected current predetermined status and wherein the second predetermined touch area provides a plurality of touch function buttons, pressing each of the plurality of touch function buttons activates the electronic device to be in the current predetermined status of the plurality of predetermined stauses for allowing a corresponding predetermined parameter of the plurality of predetermined parameters of the audio signal to be adjusted;

adjusting the corresponding predetermined parameter of the plurality of predetermined parameter of the audio signal according to the combination of the generated corresponding status signal and the generated touch information; and outputting the audio signal that is adjusted according to the adjusted corresponding predetermined parameter.

10. The adjustment method of claim 9, wherein the first predetermined touch area is a disc-shape and set in the middle of the touch sensitive display.

11. The adjustment method of claim 9, wherein the step of identifying the touch operation on the first predetermined touch area of the touch sensitive display and generating the triggering signal further comprising:

detecting one of the plurality of touch-function buttons when the one of the plurality of touch function buttons is pressed and generating a corresponding a function signal; and executing a corresponding function according to the generated corresponding function signal.

12. The adjustment method of claim 11, wherein a position of the second predetermined touch area in the touch sensitive display set below a position of the first predetermined touch area in the touch sensitive display that is a rectangle shape.

13. The adjustment method of claim 11, wherein the second predetermined touch area comprises a last function button, a speed function button, a tone function button, a rhythm function button, and a next function button.

14. The adjustment method of claim 13, wherein the plurality of predetermined status comprise a speed status, a tone status, a rhythm status, and a play status; the speed function button, the tone function button, and the rhythm function button are respectively corresponding to the speed status, the tone status, and the rhythm status, and the last function button and the next function button are corresponding to the playing status; when the electronic device is in the speed status, a speed of the playing audio signal is adjustable, when the electronic device is in the tone status, a frequency of a bass or a treble is adjustable, when the electronic device is in the rhythm status, an intensity of the playing audio signal is adjustable, when the electronic device is in the playing status, a volume, a playing disc, and a playing speed of the audio signal being played are adjustable.

15. The adjustment method of claim 9, wherein the detected track in the first predetermined touch area of the touch sensitive display comprises a shape and the forming direction of the touch operation on the first predetermined touch area.

16. The adjustment method of claim 15, wherein the different shapes of different touch operations on the first predetermined touch area comprise an arc and a straight line.

17. The adjustment method of claim 9, wherein the touch sensitive display further comprises a display area above the first predetermined touch area, the display area displays a lyric of the playing audio signal in a rolling method.

\* \* \* \* \*